United States Patent
Hu

(10) Patent No.: US 10,990,716 B2
(45) Date of Patent: Apr. 27, 2021

(54) LOCATION SELECTION FOR MODEL ASSESSMENT SAMPLING

(71) Applicant: THE CLIMATE CORPORATION, San Francisco, CA (US)

(72) Inventor: Jie Hu, San Francisco, CA (US)

(73) Assignee: THE CLIMATE CORPORATION, San Francisco, CA (US)

( * ) Notice: Subject to any disclaimer, the term of this patent is extended or adjusted under 35 U.S.C. 154(b) by 481 days.

(21) Appl. No.: 15/729,549

(22) Filed: Oct. 10, 2017

(65) Prior Publication Data
US 2018/0260504 A1 Sep. 13, 2018

Related U.S. Application Data

(60) Provisional application No. 62/468,896, filed on Mar. 8, 2017.

(51) Int. Cl.
*G06F 30/20* (2020.01)
*G01V 3/16* (2006.01)
(Continued)

(52) U.S. Cl.
CPC ............... *G06F 30/20* (2020.01); *G01V 3/16* (2013.01); *G01V 11/002* (2013.01); *G06N 5/04* (2013.01);
(Continued)

(58) Field of Classification Search
None
See application file for complete search history.

(56) References Cited

U.S. PATENT DOCUMENTS 8,412,419 B1 4/2013 Seamon et al.
2010/0249998 A1 9/2010 Holland
(Continued)

OTHER PUBLICATIONS

Wollenhaupt et al. Soil Sampling and Interpolation Techniques for Mapping Spatial Variability of Soil Properties. In: The State of Site-Specific Management for Agriculture, F.J. Pierce and E.J. Sadler (ed.), American Society of Agronomy, 1997, pp. 19-53.*
(Continued)

*Primary Examiner* — Michael L Borin
(74) *Attorney, Agent, or Firm* — Hickman Becker Bingham Ledesma LLP

(57) ABSTRACT

In an embodiment, a computer-implemented method of selecting sampling locations in a field is disclosed. The method comprises receiving, by a processor, input data including a map for a management zone in a field indicating one or more values of a set of agricultural characteristics for each of a plurality of locations in the management zone. The method further comprises identifying, by the processor, a set of values for the set of agricultural characteristics for each of a group of locations in the management zone based on map. In addition, the method comprises normalizing a set of model values for the set of agricultural characteristics used by an agricultural modeling tool and the set of values of the set of agricultural characteristics for each of the group of locations in the management zone. The method also comprises selecting one of the group of locations as a sampling location based on the normalized set of model values, the normalized sets of values for the group of locations, and a first distance constraint related to a distance to a boundary of the management zone. Finally, the method comprises causing display of information regarding the selected location.

20 Claims, 10 Drawing Sheets

(51) Int. Cl.
  *G01V 11/00* (2006.01)
  *G06N 5/04* (2006.01)
  *A01B 79/00* (2006.01)
  *G06N 20/00* (2019.01)
  *G06N 3/12* (2006.01)

(52) U.S. Cl.
  CPC ............ *A01B 79/005* (2013.01); *G06N 3/126* (2013.01); *G06N 20/00* (2019.01)

(56) References Cited

U.S. PATENT DOCUMENTS

| | | |
|---|---|---|
| 2011/0295500 A1 | 12/2011 | Hunt et al. |
| 2013/0104455 A1 | 5/2013 | Groeneveld |
| 2016/0066505 A1 | 3/2016 | Bakke et al. |
| 2016/0183450 A2 | 6/2016 | Koch et al. |
| 2016/0223511 A1 | 8/2016 | Koshnick et al. |

OTHER PUBLICATIONS

International Searching Authority, "Search Report" in application No. PCT/US2018/021598, dated Apr. 27, 2018, 18 pages.
Current Claims in application No. PCT/US2018/021598, dated Apr. 2018, 4 pages.

\* cited by examiner

200 Mobile Computer Application

| 208 Seeds and Planting Instructions | 210 Nitrogen Instructions | 212 Weather Instructions | 214 Field Health Instructions | 216 Performance Instructions |

206 Digital Map Book

205 Script Generation Instructions

204 Overview and Alert Instructions

202 Account, Fields, Data Ingestion, Sharing Instructions

(b)

220 Cab Computer Application

| 222 Maps - Cab | 224 Remote View | 226 Data Collect and Transfer | 228 Machine Alerts | 230 Script Transfer |

232 Scouting - Cab

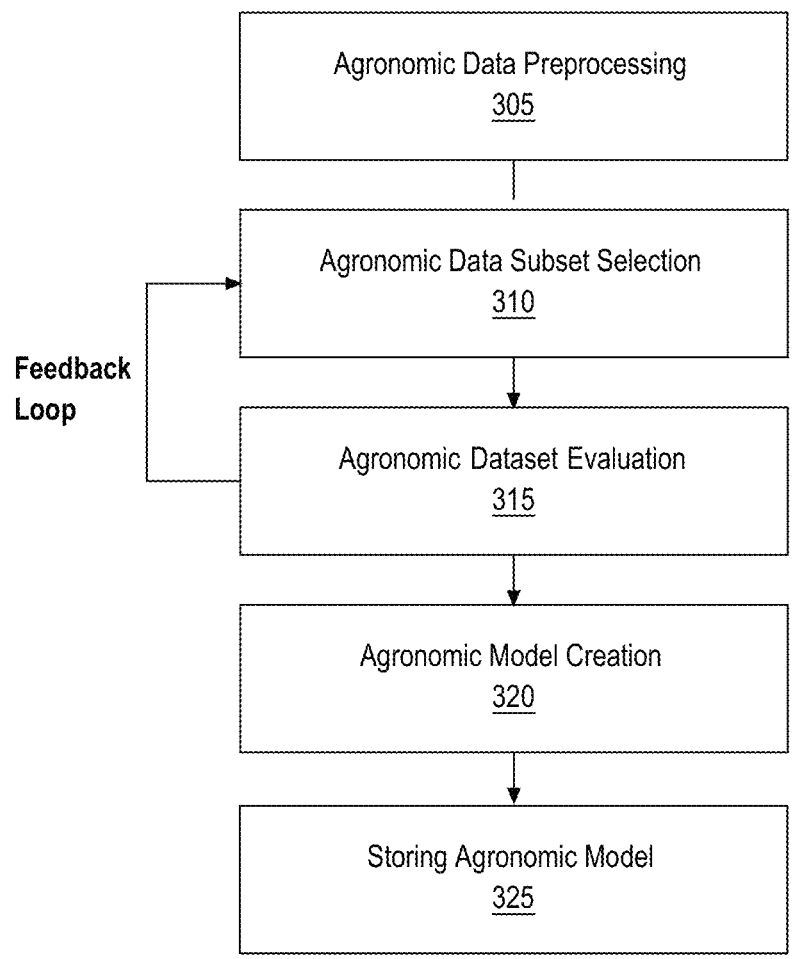

FIG. 5

Data Manager

| | Planting 1(4 Fields)<br>Crop Corn Product<br>Plant Date: 2016-04-12<br>ILU 112 \| Pop: 34000<br>[Edit] [Apply] | Planting 2(0 Fields)<br>Crop Corn Product<br>Plant Date: 2016-04-15<br>ILU 83 \| Pop: 34000<br>[Edit] [Apply] | Planting 3(0 Fields)<br>Crop Corn Product<br>Plant Date: 2016-04-13<br>ILU 83 \| Pop: 34000<br>[Edit] [Apply] | Planting 4(1 Fields)<br>Crop Corn Product<br>Plant Date: 2016-04-13<br>ILU 112 \| Pop: 34000<br>[Edit] [Apply] | Add New<br>Planting Plan |

[Nitrogen] [Planting] [Practices] [Soil]

| | CROP | PLANTED ACRES | PRODUCT | RELATIVE MATURITY | TARGET YIELD | POPULATION(AVG) | PLA |
|---|---|---|---|---|---|---|---|
| ☐ Select All | | | | | | | |
| ☐ Ames, IA 1<br>Corn \| 100 \| Boone, IA | Corn | — | DMC82-M | 112 | 160 | 34000 | Apr |
| ☐ Austin, MN 1<br>Corn \| 100 \| Fredricks, MN | Corn | — | DMC82-M | 114 | 160 | 36000 | Apr |
| ☐ Boone, IN 1<br>Corn \| 100 \| Boone, IA | Corn | — | DMC82-M | 112 | 150 | 34000 | Apr |
| ☐ Champaign 1<br>Corn \| 100 \| Champaign, IL | Corn | — | — | 112 | 200 | 34000 | Apr |
| ☐ E Nebraska 1<br>Corn \| 100 \| Burt, NE | Corn | — | — | 112 | 160 | 34000 | Apr |

*FIG. 6*

LOCATION SELECTION FOR MODEL ASSESSMENT SAMPLING

RELATED APPLICATION

This application claims the benefit under 35 U.S.C. § 119(e) of provisional application 62/468,896, filed Mar. 8, 2017, the entire contents of which is hereby incorporated by reference for all purposes as if fully set forth herein.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright or rights whatsoever. © 2015-2017 The Climate Corporation.

FIELD OF THE DISCLOSURE

The present disclosure relates to the technical field of agricultural sampling. The disclosure relates more specifically to the technical field of computer-implemented selection of sampling locations for proper performance assessment of agricultural modeling.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Application of an agricultural treatment to a crop field, such as a soil fertilizer, can help improve the health of the crop field and increase yield. As an agricultural treatment may require a substantial investment of time, labor, or money, an agricultural modeling tool could assist in applying such an agricultural treatment in a precise, cost-effective manner. For example, the agricultural modeling tool can predict the amount of nitrate currently in the soil based on the soil's physical properties, field topography, or other environmental factors, and growers could use the model-predicted nitrate levels to determine the amount of nitrogen fertilizers that need to be added to the soil to achieve a certain crop yield. However, variability often exists in one of the soil's physical properties across a crop field, for example. Modeling results produced by the agricultural modeling tool would be more accurate when the actual field condition is similar to the field condition assumed by the agricultural modeling tool.

SUMMARY

The appended claims may serve as a summary of the disclosure.

BRIEF DESCRIPTION OF THE DRAWINGS

In the drawings:

FIG. 2 illustrates two views of an example logical organization of sets of instructions in main memory when an example mobile application is loaded for execution.

FIG. 3 illustrates a programmed process by which the agricultural intelligence computer system generates one or more preconfigured agronomic models using agronomic data provided by one or more data sources.

FIG. 5 depicts an example embodiment of a timeline view for data entry.

FIG. 6 depicts an example embodiment of a spreadsheet view for data entry.

DETAILED DESCRIPTION

Figure 1:
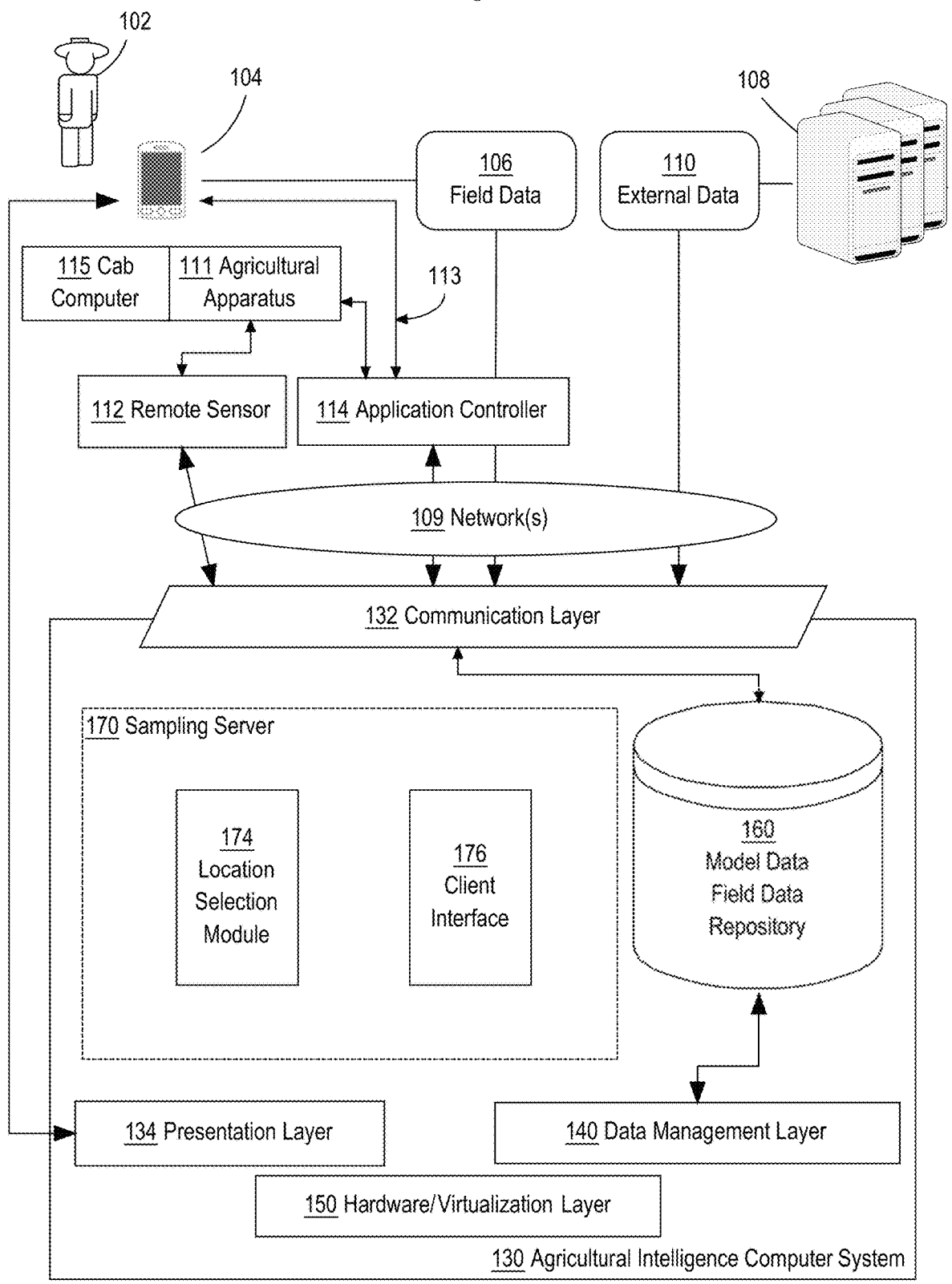
FIG. 1 illustrates an example computer system that is configured to perform the functions described herein, shown in a field environment with other apparatus with which the system may interoperate.

In the following description, for the purposes of explanation, numerous specific details are set forth in order to provide a thorough understanding of the present disclosure. It will be apparent, however, that embodiments may be practiced without these specific details. In other instances, well-known structures and devices are shown in block diagram form in order to avoid unnecessarily obscuring the present disclosure. Embodiments are disclosed in sections according to the following outline:

1. GENERAL OVERVIEW
2. EXAMPLE AGRICULTURAL INTELLIGENCE COMPUTER SYSTEM
　2.1. STRUCTURAL OVERVIEW
　2.2. APPLICATION PROGRAM OVERVIEW
　2.3. DATA INGEST TO THE COMPUTER SYSTEM
　2.4. PROCESS OVERVIEW—AGRONOMIC MODEL TRAINING
　2.5. IMPLEMENTATION EXAMPLE—HARDWARE OVERVIEW
3 FUNCTIONAL DESCRIPTION
　3.1 GENERATING FIELD DATA OR MODEL DATA
　3.2 NORMALIZING OR WEIGHTING AGRICULTURAL CHARACTERISTIC VALUES
　3.3 SELECTING SAMPLING LOCATIONS
　3.4 EXAMPLE PROCESSES

1. General Overview

Embodiments may be applied in the field of agricultural management in which computer-implemented agricultural modeling processes are used to determine the current field condition and identify possible treatments to apply to the fields. While large variability may exist across a field or subfield in an agricultural characteristic, such as one of the soil's physical properties, a grower tends to work in a small number of subfields, in each of which the grower would apply an agricultural modeling tool once or a small number of times and adopt the modeling results for the entire subfield. The subfields will be referred to as management zones hereinafter. In that case, the modeling parameters of the agricultural modeling tool corresponding to the agricultural characteristics can be set to aggregated values of the agricultural characteristics over the management zone. Upon receiving the modeling results, such as that the soil currently contains a certain amount of nitrate, the grower might then want to selectively take a measurement to validate the agricultural modeling tool.

In various embodiments, a sampling system, process, or computer program product for selecting a location in a management zone for validating an agricultural modeling tool is disclosed. The sampling system is configured to select sampling locations that are similar to the field condition assumed by an agricultural modeling tool for properly assessing the performance of the agricultural modeling tool. More specifically, the sampling system is configured to identify a location within the management zone having values of the agricultural characteristics that are similar to the aggregated values or whichever model values used by the agricultural modeling tool.

In some embodiments, from a given map indicating values of the agricultural characteristics for certain locations within a management zone, the sampling system is configured to identify a set of candidate sampling locations and determine the agricultural characteristic values for these candidate sampling locations. The general objective is to increase the number of candidate sampling locations subject to certain distance or other constraints. Next, the sampling system is configured to normalize or weight values of the agricultural characteristics for the candidate sampling locations and also the model values for the agricultural modeling tool to increase the effectiveness of comparing two sets of agricultural characteristic values. For example, a unit change in an agricultural characteristic having a smaller global range may be more significant than a unit change in an agricultural characteristic having a larger global range.

In some embodiments, the sampling system is programmed to then identify one or more candidate sampling locations from the management zone having agricultural characteristic values that are optimally similar to the model values. The selection can be subject to additional constraints, such as favoring a small distance to the boundary of the management zone or having a minimum distance to the boundary of the management zone among the candidate sampling locations under consideration. The sampling system is further programmed to output information regarding a selected location, such as its geographical coordinate, distance to the boundary of the management zone, agricultural characteristic values, or their differences from the model values. In addition, the sampling system can be configured to allow a grower to describe an outcome measured from the selected location corresponding to the modeling result, such as the actual nitrate level, compare that measured outcome to the modeling result, and provide further information to a grower or back to the agricultural modeling tool.

The sampling system has many technical benefits. First, the sampling system allows a grower to validate an agricultural modeling tool, which can give a grower confidence in generalizing the modeling results for an entire field or subfield. Second, the sampling system offers flexibility in tuning its performance by accepting different weights for different agricultural characteristics and additional constraints for location selection as input data. Third, the sampling system is highly-scalable as it is generally not limited by the size or scope of the input data, which can include the number of or sizes of management zones or the number or complexity of agricultural characteristics.

2. Example Agricultural Intelligence Computer System 2.1 Structural Overview

FIG. 1 illustrates an example computer system that is configured to perform the functions described herein, shown in a field environment with other apparatus with which the system may interoperate. In one embodiment, a user 102 owns, operates or possesses a field manager computing device 104 in a field location or associated with a field location such as a field intended for agricultural activities or a management location for one or more agricultural fields. The field manager computer device 104 is programmed or configured to provide field data 106 to an agricultural intelligence computer system 130 via one or more networks 109.

Examples of field data 106 include (a) identification data (for example, acreage, field name, field identifiers, geographic identifiers, boundary identifiers, crop identifiers, and any other suitable data that may be used to identify farm land, such as a common land unit (CLU), lot and block number, a parcel number, geographic coordinates and boundaries, Farm Serial Number (FSN), farm number, tract number, field number, section, township, and/or range), (b) harvest data (for example, crop type, crop variety, crop rotation, whether the crop is grown organically, harvest date, Actual Production History (APH), expected yield, yield, crop price, crop revenue, grain moisture, tillage practice, and previous growing season information), (c) soil data (for example, type, composition, pH, organic matter (OM), cation exchange capacity (CEC)), (d) planting data (for example, planting date, seed(s) type, relative maturity (RM) of planted seed(s), seed population), (e) fertilizer data (for example, nutrient type (Nitrogen, Phosphorous, Potassium), application type, application date, amount, source, method), (f) chemical application data (for example, pesticide, herbicide, fungicide, other substance or mixture of substances intended for use as a plant regulator, defoliant, or desiccant, application date, amount, source, method), (g) irrigation data (for example, application date, amount, source, method), (h) weather data (for example, precipitation, rainfall rate, predicted rainfall, water runoff rate region, temperature, wind, forecast, pressure, visibility, clouds, heat index, dew point, humidity, snow depth, air quality, sunrise, sunset), (i) imagery data (for example, imagery and light spectrum information from an agricultural apparatus sensor, camera, computer, smartphone, tablet, unmanned aerial vehicle, planes or satellite), (j) scouting observations (photos, videos, free form notes, voice recordings, voice transcriptions, weather conditions (temperature, precipitation (current and over time), soil moisture, crop growth stage, wind velocity, relative humidity, dew point, black layer)), and (k) soil, seed, crop phenology, pest and disease reporting, and predictions sources and databases.

A data server computer 108 is communicatively coupled to agricultural intelligence computer system 130 and is programmed or configured to send external data 110 to agricultural intelligence computer system 130 via the network(s) 109. The external data server computer 108 may be owned or operated by the same legal person or entity as the agricultural intelligence computer system 130, or by a different person or entity such as a government agency, non-governmental organization (NGO), and/or a private data service provider. Examples of external data include weather data, imagery data, soil data, or statistical data relating to crop yields, among others. External data 110 may consist of the same type of information as field data 106. In some embodiments, the external data 110 is provided by an external data server 108 owned by the same entity that owns and/or operates the agricultural intelligence computer system 130. For example, the agricultural intelligence computer system 130 may include a data server focused exclusively on a type of data that might otherwise be obtained from third party sources, such as weather data. In some embodiments, an external data server 108 may actually be incorporated within the system 130.

An agricultural apparatus 111 may have one or more remote sensors 112 fixed thereon, which sensors are communicatively coupled either directly or indirectly via agricultural apparatus 111 to the agricultural intelligence computer system 130 and are programmed or configured to send sensor data to agricultural intelligence computer system 130. Examples of agricultural apparatus 111 include tractors, combines, harvesters, planters, trucks, fertilizer equipment, aerial vehicles including unmanned aerial vehicles, and any other item of physical machinery or hardware, typically mobile machinery, and which may be used in tasks associated with agriculture. In some embodiments, a single unit of apparatus 111 may comprise a plurality of sensors 112 that are coupled locally in a network on the apparatus; controller area network (CAN) is example of such a network that can be installed in combines, harvesters, sprayers, and cultivators. Application controller 114 is communicatively coupled to agricultural intelligence computer system 130 via the network(s) 109 and is programmed or configured to receive one or more scripts that are used to control an operating parameter of an agricultural vehicle or implement from the agricultural intelligence computer system 130. For instance, a controller area network (CAN) bus interface may be used to enable communications from the agricultural intelligence computer system 130 to the agricultural apparatus 111, such as how the CLIMATE FIELDVIEW DRIVE, available from The Climate Corporation, San Francisco, Calif., is used. Sensor data may consist of the same type of information as field data 106. In some embodiments, remote sensors 112 may not be fixed to an agricultural apparatus 111 but may be remotely located in the field and may communicate with network 109.

The apparatus 111 may comprise a cab computer 115 that is programmed with a cab application, which may comprise a version or variant of the mobile application for device 104 that is further described in other sections herein. In an embodiment, cab computer 115 comprises a compact computer, often a tablet-sized computer or smartphone, with a graphical screen display, such as a color display, that is mounted within an operator's cab of the apparatus 111. Cab computer 115 may implement some or all of the operations and functions that are described further herein for the mobile computer device 104.

The network(s) 109 broadly represent any combination of one or more data communication networks including local area networks, wide area networks, internetworks or internets, using any of wireline or wireless links, including terrestrial or satellite links. The network(s) may be implemented by any medium or mechanism that provides for the exchange of data between the various elements of FIG. 1. The various elements of FIG. 1 may also have direct (wired or wireless) communications links. The sensors 112, controller 114, external data server computer 108, and other elements of the system each comprise an interface compatible with the network(s) 109 and are programmed or configured to use standardized protocols for communication across the networks such as TCP/IP, Bluetooth, CAN protocol and higher-layer protocols such as HTTP, TLS, and the like.

Agricultural intelligence computer system 130 is programmed or configured to receive field data 106 from field manager computing device 104, external data 110 from external data server computer 108, and sensor data from remote sensor 112. Agricultural intelligence computer system 130 may be further configured to host, use or execute one or more computer programs, other software elements, digitally programmed logic such as FPGAs or ASICs, or any combination thereof to perform translation and storage of data values, construction of digital models of one or more crops on one or more fields, generation of recommendations and notifications, and generation and sending of scripts to application controller 114, in the manner described further in other sections of this disclosure.

In an embodiment, agricultural intelligence computer system 130 is programmed with or comprises a communication layer 132, presentation layer 134, data management layer 140, hardware/virtualization layer 150, and model and field data repository 160. "Layer," in this context, refers to any combination of electronic digital interface circuits, microcontrollers, firmware such as drivers, and/or computer programs or other software elements.

Communication layer 132 may be programmed or configured to perform input/output interfacing functions including sending requests to field manager computing device 104, external data server computer 108, and remote sensor 112 for field data, external data, and sensor data respectively. Communication layer 132 may be programmed or configured to send the received data to model and field data repository 160 to be stored as field data 106.

Presentation layer 134 may be programmed or configured to generate a graphical user interface (GUI) to be displayed on field manager computing device 104, cab computer 115 or other computers that are coupled to the system 130 through the network 109. The GUI may comprise controls for inputting data to be sent to agricultural intelligence computer system 130, generating requests for models and/or recommendations, and/or displaying recommendations, notifications, models, and other field data.

Data management layer 140 may be programmed or configured to manage read operations and write operations involving the repository 160 and other functional elements of the system, including queries and result sets communicated between the functional elements of the system and the repository. Examples of data management layer 140 include JDBC, SQL server interface code, and/or HADOOP interface code, among others. Repository 160 may comprise a database. As used herein, the term "database" may refer to either a body of data, a relational database management system (RDBMS), or to both. As used herein, a database may comprise any collection of data including hierarchical databases, relational databases, flat file databases, object-relational databases, object oriented databases, distributed databases, and any other structured collection of records or data that is stored in a computer system. Examples of RDBMS's include, but are not limited to including, ORACLE®, MYSQL, IBM® DB2, MICROSOFT® SQL SERVER, SYBASE®, and POSTGRESQL databases. However, any database may be used that enables the systems and methods described herein.

When field data 106 is not provided directly to the agricultural intelligence computer system via one or more agricultural machines or agricultural machine devices that interacts with the agricultural intelligence computer system, the user may be prompted via one or more user interfaces on the user device (served by the agricultural intelligence computer system) to input such information. In an example embodiment, the user may specify identification data by accessing a map on the user device (served by the agricultural intelligence computer system) and selecting specific CLUs that have been graphically shown on the map. In an alternative embodiment, the user 102 may specify identification data by accessing a map on the user device (served by the agricultural intelligence computer system 130) and drawing boundaries of the field over the map. Such CLU selection or map drawings represent geographic identifiers. In alternative embodiments, the user may specify identification data by accessing field identification data (provided as shape files or in a similar format) from the U. S. Department of Agriculture Farm Service Agency or other source via the user device and providing such field identification data to the agricultural intelligence computer system.

In an example embodiment, the agricultural intelligence computer system 130 is programmed to generate and cause displaying a graphical user interface comprising a data manager for data input. After one or more fields have been identified using the methods described above, the data manager may provide one or more graphical user interface widgets which when selected can identify changes to the field, soil, crops, tillage, or nutrient practices. The data manager may include a timeline view, a spreadsheet view, and/or one or more editable programs.

Figure 5:
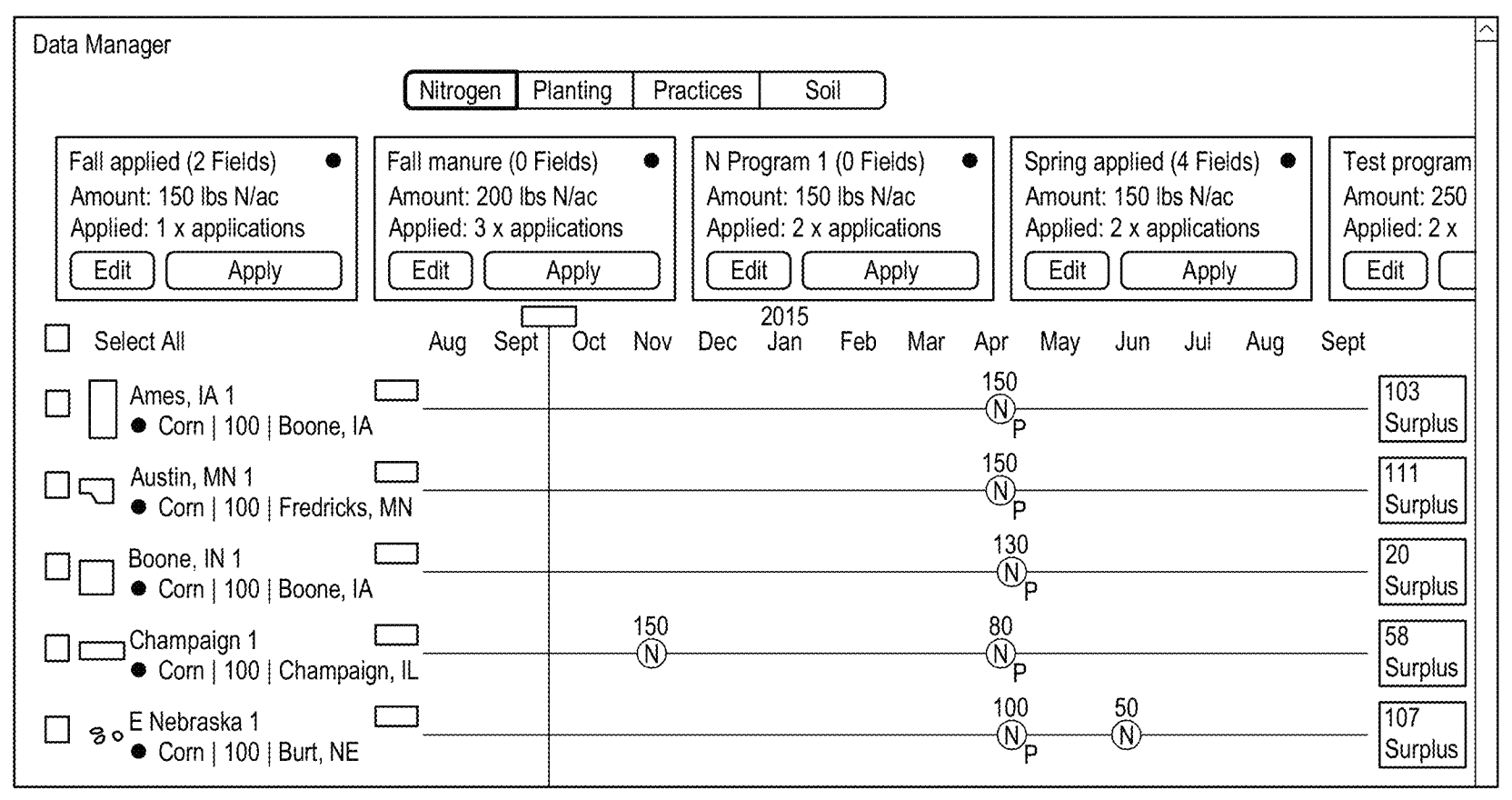

FIG. 5 depicts an example embodiment of a timeline view for data entry. Using the display depicted in FIG. 5, a user computer can input a selection of a particular field and a particular date for the addition of event. Events depicted at the top of the timeline may include Nitrogen, Planting, Practices, and Soil. To add a nitrogen application event, a user computer may provide input to select the nitrogen tab. The user computer may then select a location on the timeline for a particular field in order to indicate an application of nitrogen on the selected field. In response to receiving a selection of a location on the timeline for a particular field, the data manager may display a data entry overlay, allowing the user computer to input data pertaining to nitrogen applications, planting procedures, soil application, tillage procedures, irrigation practices, or other information relating to the particular field. For example, if a user computer selects a portion of the timeline and indicates an application of nitrogen, then the data entry overlay may include fields for inputting an amount of nitrogen applied, a date of application, a type of fertilizer used, and any other information related to the application of nitrogen.

In an embodiment, the data manager provides an interface for creating one or more programs. "Program," in this context, refers to a set of data pertaining to nitrogen applications, planting procedures, soil application, tillage procedures, irrigation practices, or other information that may be related to one or more fields, and that can be stored in digital data storage for reuse as a set in other operations. After a program has been created, it may be conceptually applied to one or more fields and references to the program may be stored in digital storage in association with data identifying the fields. Thus, instead of manually entering identical data relating to the same nitrogen applications for multiple different fields, a user computer may create a program that indicates a particular application of nitrogen and then apply the program to multiple different fields. For example, in the timeline view of FIG. 5, the top two timelines have the "Spring applied" program selected, which includes an application of 150 lbs N/ac in early April. The data manager may provide an interface for editing a program. In an embodiment, when a particular program is edited, each field that has selected the particular program is edited. For example, in FIG. 5, if the "Spring applied" program is edited to reduce the application of nitrogen to 130 lbs N/ac, the top two fields may be updated with a reduced application of nitrogen based on the edited program.

In an embodiment, in response to receiving edits to a field that has a program selected, the data manager removes the correspondence of the field to the selected program. For example, if a nitrogen application is added to the top field in FIG. 5, the interface may update to indicate that the "Spring applied" program is no longer being applied to the top field. While the nitrogen application in early April may remain, updates to the "Spring applied" program would not alter the April application of nitrogen.

FIG. 6 depicts an example embodiment of a spreadsheet view for data entry.

Using the display depicted in FIG. 6, a user can create and edit information for one or more fields. The data manager may include spreadsheets for inputting information with respect to Nitrogen, Planting, Practices, and Soil as depicted in FIG. 6. To edit a particular entry, a user computer may select the particular entry in the spreadsheet and update the values. For example, FIG. 6 depicts an in-progress update to a target yield value for the second field. Additionally, a user computer may select one or more fields in order to apply one or more programs. In response to receiving a selection of a program for a particular field, the data manager may automatically complete the entries for the particular field based on the selected program. As with the timeline view, the data manager may update the entries for each field associated with a particular program in response to receiving an update to the program. Additionally, the data manager may remove the correspondence of the selected program to the field in response to receiving an edit to one of the entries for the field.

In an embodiment, model and field data is stored in model and field data repository 160. Model data comprises data models created for one or more fields. For example, a crop model may include a digitally constructed model of the development of a crop on the one or more fields. "Model," in this context, refers to an electronic digitally stored set of executable instructions and data values, associated with one another, which are capable of receiving and responding to a programmatic or other digital call, invocation, or request for resolution based upon specified input values, to yield one or more stored or calculated output values that can serve as the basis of computer-implemented recommendations, output data displays, or machine control, among other things. Persons of skill in the field find it convenient to express models using mathematical equations, but that form of expression does not confine the models disclosed herein to abstract concepts; instead, each model herein has a practical application in a computer in the form of stored executable instructions and data that implement the model using the computer. The model may include a model of past events on the one or more fields, a model of the current status of the one or more fields, and/or a model of predicted events on the one or more fields. Model and field data may be stored in data structures in memory, rows in a database table, in flat files or spreadsheets, or other forms of stored digital data.

In an embodiment, agricultural intelligence computer system 130 is programmed with or comprises a sampling server ("server") 170. The server 170 is further configured to comprise a location selection module 174 and a client interface 176. The location selection module 174 is configured to select locations for validating modeling results. The locations selected can depend on modeling needs. The location selection module 174 can also be configured to evaluate the selected locations. The client interface 176 is configured to communicate with a client device, such as a field manager computing device 104 or a cab computer 115, over a communication network, through the communication layer 132. The communication can include receiving input data, such as field data, model data, or user objectives, and transmitting output data, such as information regarding selected locations. The client interface 176 can also be configured to communicate with a display device or a remote system that develops or maintains an agricultural modeling tool.

Each component of the server 170 comprises a set of one or more pages of main memory, such as RAM, in the agricultural intelligence computer system 130 into which executable instructions have been loaded and which when executed cause the agricultural intelligence computing system to perform the functions or operations that are described herein with reference to those modules. For example, the location selection module 174 may comprise a set of pages in RAM that contain instructions which when executed cause performing the location selection functions that are described herein. The instructions may be in machine executable code in the instruction set of a CPU and may have been compiled based upon source code written in JAVA, C, C++, OBJECTIVE-C, or any other human-readable programming language or environment, alone or in combination with scripts in JAVASCRIPT, other scripting languages and other programming source text. The term "pages" is intended to refer broadly to any region within main memory and the specific terminology used in a system may vary depending on the memory architecture or processor architecture. In another embodiment, each component of the server 170 also may represent one or more files or projects of source code that are digitally stored in a mass storage device such as non-volatile RAM or disk storage, in the agricultural intelligence computer system 130 or a separate repository system, which when compiled or interpreted cause generating executable instructions which when executed cause the agricultural intelligence computing system to perform the functions or operations that are described herein with reference to those modules. In other words, the drawing figure may represent the manner in which programmers or software developers organize and arrange source code for later compilation into an executable, or interpretation into bytecode or the equivalent, for execution by the agricultural intelligence computer system 130.

Figure 4:
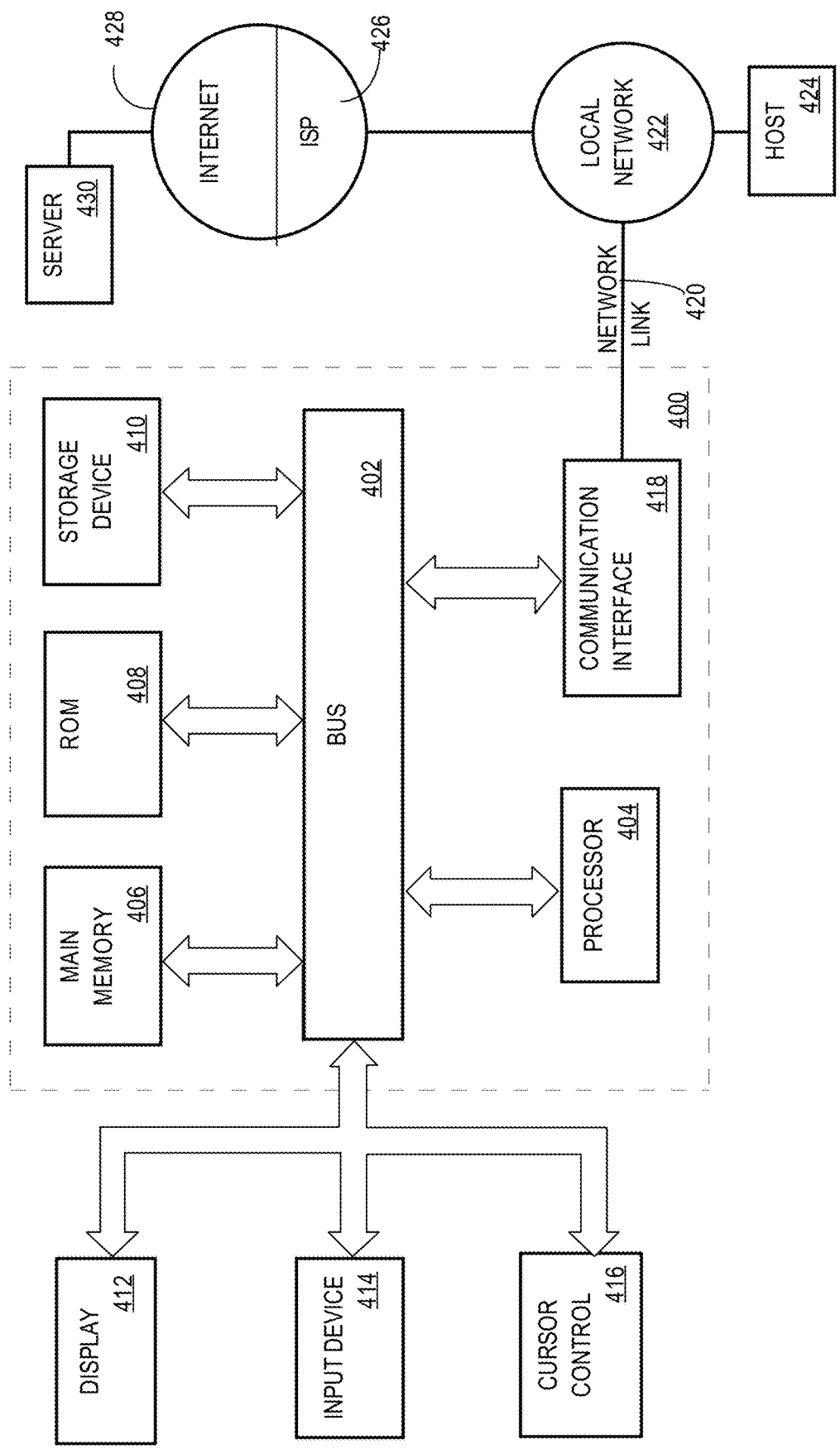
FIG. 4 is a block diagram that illustrates a computer system upon which an embodiment of the invention may be implemented.

Hardware/virtualization layer 150 comprises one or more central processing units (CPUs), memory controllers, and other devices, components, or elements of a computer system such as volatile or non-volatile memory, non-volatile storage such as disk, and I/O devices or interfaces as illustrated and described, for example, in connection with FIG. 4. The layer 150 also may comprise programmed instructions that are configured to support virtualization, containerization, or other technologies.

For purposes of illustrating a clear example, FIG. 1 shows a limited number of instances of certain functional elements. However, in other embodiments, there may be any number of such elements. For example, embodiments may use thousands or millions of different mobile computing devices 104 associated with different users. Further, the system 130 and/or external data server computer 108 may be implemented using two or more processors, cores, clusters, or instances of physical machines or virtual machines, configured in a discrete location or co-located with other elements in a datacenter, shared computing facility or cloud computing facility.

2.2. Application Program Overview

In an embodiment, the implementation of the functions described herein using one or more computer programs or other software elements that are loaded into and executed using one or more general-purpose computers will cause the general-purpose computers to be configured as a particular machine or as a computer that is specially adapted to perform the functions described herein. Further, each of the flow diagrams that are described further herein may serve, alone or in combination with the descriptions of processes and functions in prose herein, as algorithms, plans or directions that may be used to program a computer or logic to implement the functions that are described. In other words, all the prose text herein, and all the drawing figures, together are intended to provide disclosure of algorithms, plans or directions that are sufficient to permit a skilled person to program a computer to perform the functions that are described herein, in combination with the skill and knowledge of such a person given the level of skill that is appropriate for inventions and disclosures of this type.

In an embodiment, user 102 interacts with agricultural intelligence computer system 130 using field manager computing device 104 configured with an operating system and one or more application programs or apps; the field manager computing device 104 also may interoperate with the agricultural intelligence computer system independently and automatically under program control or logical control and direct user interaction is not always required. Field manager computing device 104 broadly represents one or more of a smart phone, PDA, tablet computing device, laptop computer, desktop computer, workstation, or any other computing device capable of transmitting and receiving information and performing the functions described herein. Field manager computing device 104 may communicate via a network using a mobile application stored on field manager computing device 104, and in some embodiments, the device may be coupled using a cable 113 or connector to the sensor 112 and/or controller 114. A particular user 102 may own, operate or possess and use, in connection with system 130, more than one field manager computing device 104 at a time.

The mobile application may provide client-side functionality, via the network to one or more mobile computing devices. In an example embodiment, field manager computing device 104 may access the mobile application via a web browser or a local client application or app. Field manager computing device 104 may transmit data to, and receive data from, one or more front-end servers, using web-based protocols or formats such as HTTP, XML and/or JSON, or app-specific protocols. In an example embodiment, the data may take the form of requests and user information input, such as field data, into the mobile computing device. In some embodiments, the mobile application interacts with location tracking hardware and software on field manager computing device 104 which determines the location of field manager computing device 104 using standard tracking techniques such as multilateration of radio signals, the global positioning system (GPS), WiFi positioning systems, or other methods of mobile positioning. In some cases, location data or other data associated with the device 104, user 102, and/or user account(s) may be obtained by queries to an operating system of the device or by requesting an app on the device to obtain data from the operating system.

In an embodiment, field manager computing device 104 sends field data 106 to agricultural intelligence computer system 130 comprising or including, but not limited to, data values representing one or more of: a geographical location of the one or more fields, tillage information for the one or more fields, crops planted in the one or more fields, and soil data extracted from the one or more fields. Field manager computing device 104 may send field data 106 in response to user input from user 102 specifying the data values for the one or more fields. Additionally, field manager computing device 104 may automatically send field data 106 when one or more of the data values becomes available to field manager computing device 104. For example, field manager computing device 104 may be communicatively coupled to remote sensor 112 and/or application controller 114 which include an irrigation sensor and/or irrigation controller. In response to receiving data indicating that application controller 114 released water onto the one or more fields, field manager computing device 104 may send field data 106 to agricultural intelligence computer system 130 indicating that water was released on the one or more fields. Field data 106 identified in this disclosure may be input and communicated using electronic digital data that is communicated between computing devices using parameterized URLs over HTTP, or another suitable communication or messaging protocol.

A commercial example of the mobile application is CLIMATE FIELDVIEW, commercially available from The Climate Corporation, San Francisco, Calif. The CLIMATE FIELDVIEW application, or other applications, may be modified, extended, or adapted to include features, functions, and programming that have not been disclosed earlier than the filing date of this disclosure. In one embodiment, the mobile application comprises an integrated software platform that allows a grower to make fact-based decisions for their operation because it combines historical data about the grower's fields with any other data that the grower wishes to compare. The combinations and comparisons may be performed in real time and are based upon scientific models that provide potential scenarios to permit the grower to make better, more informed decisions.

FIG. 2 illustrates two views of an example logical organization of sets of instructions in main memory when an example mobile application is loaded for execution. In FIG. 2, each named element represents a region of one or more pages of RAM or other main memory, or one or more blocks of disk storage or other non-volatile storage, and the programmed instructions within those regions. In one embodiment, in view (a), a mobile computer application 200 comprises account-fields-data ingestion-sharing instructions 202, overview and alert instructions 204, digital map book instructions 206, seeds and planting instructions 208, nitrogen instructions 210, weather instructions 212, field health instructions 214, and performance instructions 216.

In one embodiment, a mobile computer application 200 comprises account, fields, data ingestion, sharing instructions 202 which are programmed to receive, translate, and ingest field data from third party systems via manual upload or APIs. Data types may include field boundaries, yield maps, as-planted maps, soil test results, as-applied maps, and/or management zones, among others. Data formats may include shape files, native data formats of third parties, and/or farm management information system (FMIS) exports, among others. Receiving data may occur via manual upload, e-mail with attachment, external APIs that push data to the mobile application, or instructions that call APIs of external systems to pull data into the mobile application. In one embodiment, mobile computer application 200 comprises a data inbox. In response to receiving a selection of the data inbox, the mobile computer application 200 may display a graphical user interface for manually uploading data files and importing uploaded files to a data manager.

In one embodiment, digital map book instructions 206 comprise field map data layers stored in device memory and are programmed with data visualization tools and geospatial field notes. This provides growers with convenient information close at hand for reference, logging and visual insights into field performance. In one embodiment, overview and alert instructions 204 are programmed to provide an operation-wide view of what is important to the grower, and timely recommendations to take action or focus on particular issues. This permits the grower to focus time on what needs attention, to save time and preserve yield throughout the season. In one embodiment, seeds and planting instructions 208 are programmed to provide tools for seed selection, hybrid placement, and script creation, including variable rate (VR) script creation, based upon scientific models and empirical data. This enables growers to maximize yield or return on investment through optimized seed purchase, placement and population.

In one embodiment, script generation instructions 205 are programmed to provide an interface for generating scripts, including variable rate (VR) fertility scripts. The interface enables growers to create scripts for field implements, such as nutrient applications, planting, and irrigation. For example, a planting script interface may comprise tools for identifying a type of seed for planting. Upon receiving a selection of the seed type, mobile computer application 200 may display one or more fields broken into management zones, such as the field map data layers created as part of digital map book instructions 206. In one embodiment, the management zones comprise soil zones along with a panel identifying each soil zone and a soil name, texture, drainage for each zone, or other field data. Mobile computer application 200 may also display tools for editing or creating such, such as graphical tools for drawing management zones, such as soil zones, over a map of one or more fields. Planting procedures may be applied to all management zones or different planting procedures may be applied to different subsets of management zones. When a script is created, mobile computer application 200 may make the script available for download in a format readable by an application controller, such as an archived or compressed format. Additionally, and/or alternatively, a script may be sent directly to cab computer 115 from mobile computer application 200 and/or uploaded to one or more data servers and stored for further use.

In one embodiment, nitrogen instructions 210 are programmed to provide tools to inform nitrogen decisions by visualizing the availability of nitrogen to crops. This enables growers to maximize yield or return on investment through optimized nitrogen application during the season. Example programmed functions include displaying images such as SSURGO images to enable drawing of fertilizer application zones and/or images generated from subfield soil data, such as data obtained from sensors, at a high spatial resolution (as fine as millimeters or smaller depending on sensor proximity and resolution); upload of existing grower-defined zones; providing a graph of plant nutrient availability and/or a map to enable tuning application(s) of nitrogen across multiple zones; output of scripts to drive machinery; tools for mass data entry and adjustment; and/or maps for data visualization, among others. "Mass data entry," in this context, may mean entering data once and then applying the same data to multiple fields and/or zones that have been defined in the system; example data may include nitrogen application data that is the same for many fields and/or zones of the same grower, but such mass data entry applies to the entry of any type of field data into the mobile computer application 200. For example, nitrogen instructions 210 may be programmed to accept definitions of nitrogen application and practices programs and to accept user input specifying to apply those programs across multiple fields. "Nitrogen application programs," in this context, refers to stored, named sets of data that associates: a name, color code or other identifier, one or more dates of application, types of material or product for each of the dates and amounts, method of application or incorporation such as injected or broadcast, and/or amounts or rates of application for each of the dates, crop or hybrid that is the subject of the application, among others. "Nitrogen practices programs," in this context, refer to stored, named sets of data that associates: a practices name; a previous crop; a tillage system; a date of primarily tillage; one or more previous tillage systems that were used; one or more indicators of application type, such as manure, that were used. Nitrogen instructions 210 also may be programmed to generate and cause displaying a nitrogen graph, which indicates projections of plant use of the specified nitrogen and whether a surplus or shortfall is predicted; in some embodiments, different color indicators may signal a magnitude of surplus or magnitude of shortfall. In one embodiment, a nitrogen graph comprises a graphical display in a computer display device comprising a plurality of rows, each row associated with and identifying a field; data specifying what crop is planted in the field, the field size, the field location, and a graphic representation of the field perimeter; in each row, a timeline by month with graphic indicators specifying each nitrogen application and amount at points correlated to month names; and numeric and/or colored indicators of surplus or shortfall, in which color indicates magnitude.

In one embodiment, the nitrogen graph may include one or more user input features, such as dials or slider bars, to dynamically change the nitrogen planting and practices programs so that a user may optimize his nitrogen graph. The user may then use his optimized nitrogen graph and the related nitrogen planting and practices programs to implement one or more scripts, including variable rate (VR) fertility scripts. Nitrogen instructions 210 also may be programmed to generate and cause displaying a nitrogen map, which indicates projections of plant use of the specified nitrogen and whether a surplus or shortfall is predicted; in some embodiments, different color indicators may signal a magnitude of surplus or magnitude of shortfall. The nitrogen map may display projections of plant use of the specified nitrogen and whether a surplus or shortfall is predicted for different times in the past and the future (such as daily, weekly, monthly or yearly) using numeric and/or colored indicators of surplus or shortfall, in which color indicates magnitude. In one embodiment, the nitrogen map may include one or more user input features, such as dials or slider bars, to dynamically change the nitrogen planting and practices programs so that a user may optimize his nitrogen map, such as to obtain a preferred amount of surplus to shortfall. The user may then use his optimized nitrogen map and the related nitrogen planting and practices programs to implement one or more scripts, including variable rate (VR) fertility scripts. In other embodiments, similar instructions to the nitrogen instructions 210 could be used for application of other nutrients (such as phosphorus and potassium), application of pesticide, and irrigation programs.

In one embodiment, weather instructions 212 are programmed to provide field-specific recent weather data and forecasted weather information. This enables growers to save time and have an efficient integrated display with respect to daily operational decisions.

In one embodiment, field health instructions 214 are programmed to provide timely remote sensing images highlighting in-season crop variation and potential concerns. Example programmed functions include cloud checking, to identify possible clouds or cloud shadows; determining nitrogen indices based on field images; graphical visualization of scouting layers, including, for example, those related to field health, and viewing and/or sharing of scouting notes; and/or downloading satellite images from multiple sources and prioritizing the images for the grower, among others.

In one embodiment, performance instructions 216 are programmed to provide reports, analysis, and insight tools using on-farm data for evaluation, insights and decisions. This enables the grower to seek improved outcomes for the next year through fact-based conclusions about why return on investment was at prior levels, and insight into yield-limiting factors. The performance instructions 216 may be programmed to communicate via the network(s) 109 to back-end analytics programs executed at agricultural intelligence computer system 130 and/or external data server computer 108 and configured to analyze metrics such as yield, yield differential, hybrid, population, SSURGO zone, soil test properties, or elevation, among others. Programmed reports and analysis may include yield variability analysis, treatment effect estimation, benchmarking of yield and other metrics against other growers based on anonymized data collected from many growers, or data for seeds and planting, among others.

Applications having instructions configured in this way may be implemented for different computing device platforms while retaining the same general user interface appearance. For example, the mobile application may be programmed for execution on tablets, smartphones, or server computers that are accessed using browsers at client computers. Further, the mobile application as configured for tablet computers or smartphones may provide a full app experience or a cab app experience that is suitable for the display and processing capabilities of cab computer 115. For example, referring now to view (b) of FIG. 2, in one embodiment a cab computer application 220 may comprise maps-cab instructions 222, remote view instructions 224, data collect and transfer instructions 226, machine alerts instructions 228, script transfer instructions 230, and scouting-cab instructions 232. The code base for the instructions of view (b) may be the same as for view (a) and executables implementing the code may be programmed to detect the type of platform on which they are executing and to expose, through a graphical user interface, only those functions that are appropriate to a cab platform or full platform. This approach enables the system to recognize the distinctly different user experience that is appropriate for an in-cab environment and the different technology environment of the cab. The maps-cab instructions 222 may be programmed to provide map views of fields, farms or regions that are useful in directing machine operation. The remote view instructions 224 may be programmed to turn on, manage, and provide views of machine activity in real-time or near real-time to other computing devices connected to the system 130 via wireless networks, wired connectors or adapters, and the like. The data collect and transfer instructions 226 may be programmed to turn on, manage, and provide transfer of data collected at sensors and controllers to the system 130 via wireless networks, wired connectors or adapters, and the like. The machine alerts instructions 228 may be programmed to detect issues with operations of the machine or tools that are associated with the cab and generate operator alerts. The script transfer instructions 230 may be configured to transfer in scripts of instructions that are configured to direct machine operations or the collection of data. The scouting-cab instructions 232 may be programmed to display location-based alerts and information received from the system 130 based on the location of the field manager computing device 104, agricultural apparatus 111, or sensors 112 in the field and ingest, manage, and provide transfer of location-based scouting observations to the system 130 based on the location of the agricultural apparatus 111 or sensors 112 in the field.

2.3. Data Ingest to the Computer System

In an embodiment, external data server computer 108 stores external data 110, including soil data representing soil composition for the one or more fields and weather data representing temperature and precipitation on the one or more fields. The weather data may include past and present weather data as well as forecasts for future weather data. In an embodiment, external data server computer 108 comprises a plurality of servers hosted by different entities. For example, a first server may contain soil composition data while a second server may include weather data. Additionally, soil composition data may be stored in multiple servers. For example, one server may store data representing percentage of sand, silt, and clay in the soil while a second server may store data representing percentage of organic matter (OM) in the soil.

In an embodiment, remote sensor 112 comprises one or more sensors that are programmed or configured to produce one or more observations. Remote sensor 112 may be aerial sensors, such as satellites, vehicle sensors, planting equipment sensors, tillage sensors, fertilizer or insecticide application sensors, harvester sensors, and any other implement capable of receiving data from the one or more fields. In an embodiment, application controller 114 is programmed or configured to receive instructions from agricultural intelligence computer system 130. Application controller 114 may also be programmed or configured to control an operating parameter of an agricultural vehicle or implement. For example, an application controller may be programmed or configured to control an operating parameter of a vehicle, such as a tractor, planting equipment, tillage equipment, fertilizer or insecticide equipment, harvester equipment, or other farm implements such as a water valve. Other embodiments may use any combination of sensors and controllers, of which the following are merely selected examples.

The system 130 may obtain or ingest data under user 102 control, on a mass basis from a large number of growers who have contributed data to a shared database system. This form of obtaining data may be termed "manual data ingest" as one or more user-controlled computer operations are requested or triggered to obtain data for use by the system 130. As an example, the CLIMATE FIELDVIEW application, commercially available from The Climate Corporation, San Francisco, Calif., may be operated to export data to system 130 for storing in the repository 160.

For example, seed monitor systems can both control planter apparatus components and obtain planting data, including signals from seed sensors via a signal harness that comprises a CAN backbone and point-to-point connections for registration and/or diagnostics. Seed monitor systems can be programmed or configured to display seed spacing, population and other information to the user via the cab computer 115 or other devices within the system 130. Examples are disclosed in U.S. Pat. No. 8,738,243 and US Pat. Pub. 20150094916, and the present disclosure assumes knowledge of those other patent disclosures.

Likewise, yield monitor systems may contain yield sensors for harvester apparatus that send yield measurement data to the cab computer 115 or other devices within the system 130. Yield monitor systems may utilize one or more remote sensors 112 to obtain grain moisture measurements in a combine or other harvester and transmit these measurements to the user via the cab computer 115 or other devices within the system 130.

In an embodiment, examples of sensors 112 that may be used with any moving vehicle or apparatus of the type described elsewhere herein include kinematic sensors and position sensors. Kinematic sensors may comprise any of speed sensors such as radar or wheel speed sensors, accelerometers, or gyros. Position sensors may comprise GPS receivers or transceivers, or WiFi-based position or mapping apps that are programmed to determine location based upon nearby WiFi hotspots, among others.

In an embodiment, examples of sensors 112 that may be used with tractors or other moving vehicles include engine speed sensors, fuel consumption sensors, area counters or distance counters that interact with GPS or radar signals, PTO (power take-off) speed sensors, tractor hydraulics sensors configured to detect hydraulics parameters such as pressure or flow, and/or and hydraulic pump speed, wheel speed sensors or wheel slippage sensors. In an embodiment, examples of controllers 114 that may be used with tractors include hydraulic directional controllers, pressure controllers, and/or flow controllers; hydraulic pump speed controllers; speed controllers or governors; hitch position controllers; or wheel position controllers provide automatic steering.

In an embodiment, examples of sensors 112 that may be used with seed planting equipment such as planters, drills, or air seeders include seed sensors, which may be optical, electromagnetic, or impact sensors; downforce sensors such as load pins, load cells, pressure sensors; soil property sensors such as reflectivity sensors, moisture sensors, electrical conductivity sensors, optical residue sensors, or temperature sensors; component operating criteria sensors such as planting depth sensors, downforce cylinder pressure sensors, seed disc speed sensors, seed drive motor encoders, seed conveyor system speed sensors, or vacuum level sensors; or pesticide application sensors such as optical or other electromagnetic sensors, or impact sensors. In an embodiment, examples of controllers 114 that may be used with such seed planting equipment include: toolbar fold controllers, such as controllers for valves associated with hydraulic cylinders; downforce controllers, such as controllers for valves associated with pneumatic cylinders, airbags, or hydraulic cylinders, and programmed for applying downforce to individual row units or an entire planter frame; planting depth controllers, such as linear actuators; metering controllers, such as electric seed meter drive motors, hydraulic seed meter drive motors, or swath control clutches; hybrid selection controllers, such as seed meter drive motors, or other actuators programmed for selectively allowing or preventing seed or an air-seed mixture from delivering seed to or from seed meters or central bulk hoppers; metering controllers, such as electric seed meter drive motors, or hydraulic seed meter drive motors; seed conveyor system controllers, such as controllers for a belt seed delivery conveyor motor; marker controllers, such as a controller for a pneumatic or hydraulic actuator; or pesticide application rate controllers, such as metering drive controllers, orifice size or position controllers.

In an embodiment, examples of sensors 112 that may be used with tillage equipment include position sensors for tools such as shanks or discs; tool position sensors for such tools that are configured to detect depth, gang angle, or lateral spacing; downforce sensors; or draft force sensors. In an embodiment, examples of controllers 114 that may be used with tillage equipment include downforce controllers or tool position controllers, such as controllers configured to control tool depth, gang angle, or lateral spacing.

In an embodiment, examples of sensors 112 that may be used in relation to apparatus for applying fertilizer, insecticide, fungicide and the like, such as on-planter starter fertilizer systems, subsoil fertilizer applicators, or fertilizer sprayers, include: fluid system criteria sensors, such as flow sensors or pressure sensors; sensors indicating which spray head valves or fluid line valves are open; sensors associated with tanks, such as fill level sensors; sectional or system-wide supply line sensors, or row-specific supply line sensors; or kinematic sensors such as accelerometers disposed on sprayer booms. In an embodiment, examples of controllers 114 that may be used with such apparatus include pump speed controllers; valve controllers that are programmed to control pressure, flow, direction, PWM and the like; or position actuators, such as for boom height, subsoiler depth, or boom position.

In an embodiment, examples of sensors 112 that may be used with harvesters include yield monitors, such as impact plate strain gauges or position sensors, capacitive flow sensors, load sensors, weight sensors, or torque sensors associated with elevators or augers, or optical or other electromagnetic grain height sensors; grain moisture sensors, such as capacitive sensors; grain loss sensors, including impact, optical, or capacitive sensors; header operating criteria sensors such as header height, header type, deck plate gap, feeder speed, and reel speed sensors; separator operating criteria sensors, such as concave clearance, rotor speed, shoe clearance, or chaffer clearance sensors; auger sensors for position, operation, or speed; or engine speed sensors. In an embodiment, examples of controllers 114 that may be used with harvesters include header operating criteria controllers for elements such as header height, header type, deck plate gap, feeder speed, or reel speed; separator operating criteria controllers for features such as concave clearance, rotor speed, shoe clearance, or chaffer clearance; or controllers for auger position, operation, or speed.

In an embodiment, examples of sensors 112 that may be used with grain carts include weight sensors, or sensors for auger position, operation, or speed. In an embodiment, examples of controllers 114 that may be used with grain carts include controllers for auger position, operation, or speed.

In an embodiment, examples of sensors 112 and controllers 114 may be installed in unmanned aerial vehicle (UAV) apparatus or "drones." Such sensors may include cameras with detectors effective for any range of the electromagnetic spectrum including visible light, infrared, ultraviolet, near-infrared (NIR), and the like; accelerometers; altimeters; temperature sensors; humidity sensors; pitot tube sensors or other airspeed or wind velocity sensors; battery life sensors; or radar emitters and reflected radar energy detection apparatus; other electromagnetic radiation emitters and reflected electromagnetic radiation detection apparatus. Such controllers may include guidance or motor control apparatus, control surface controllers, camera controllers, or controllers programmed to turn on, operate, obtain data from, manage and configure any of the foregoing sensors. Examples are disclosed in U.S. patent application Ser. No. 14/831,165 and the present disclosure assumes knowledge of that other patent disclosure.

In an embodiment, sensors 112 and controllers 114 may be affixed to soil sampling and measurement apparatus that is configured or programmed to sample soil and perform soil chemistry tests, soil moisture tests, and other tests pertaining to soil. For example, the apparatus disclosed in U.S. Pat. Nos. 8,767,194 and 8,712,148 may be used, and the present disclosure assumes knowledge of those patent disclosures.

In an embodiment, sensors 112 and controllers 114 may comprise weather devices for monitoring weather conditions of fields. For example, the apparatus disclosed in U.S. Provisional Application No. 62/154,207, filed on Apr. 29, 2015, U.S. Provisional Application No. 62/175,160, filed on Jun. 12, 2015, U.S. Provisional Application No. 62/198,060, filed on Jul. 28, 2015, and U.S. Provisional Application No. 62/220,852, filed on Sep. 18, 2015, may be used, and the present disclosure assumes knowledge of those patent disclosures.

2.4. Process Overview—Agronomic Model Training

In an embodiment, the agricultural intelligence computer system 130 is programmed or configured to create an agronomic model. In this context, an agronomic model is a data structure in memory of the agricultural intelligence computer system 130 that comprises field data 106, such as identification data and harvest data for one or more fields. The agronomic model may also comprise calculated agronomic properties which describe either conditions which may affect the growth of one or more crops on a field, or properties of the one or more crops, or both. Additionally, an agronomic model may comprise recommendations based on agronomic factors such as crop recommendations, irrigation recommendations, planting recommendations, fertilizer recommendations, fungicide recommendations, pesticide recommendations, harvesting recommendations and other crop management recommendations. The agronomic factors may also be used to estimate one or more crop related results, such as agronomic yield. The agronomic yield of a crop is an estimate of quantity of the crop that is produced, or in some examples the revenue or profit obtained from the produced crop.

In an embodiment, the agricultural intelligence computer system 130 may use a preconfigured agronomic model to calculate agronomic properties related to currently received location and crop information for one or more fields. The preconfigured agronomic model is based upon previously processed field data, including but not limited to, identification data, harvest data, fertilizer data, and weather data. The preconfigured agronomic model may have been cross validated to ensure accuracy of the model. Cross validation may include comparison to ground truthing that compares predicted results with actual results on a field, such as a comparison of precipitation estimate with a rain gauge or sensor providing weather data at the same or nearby location or an estimate of nitrogen content with a soil sample measurement.

FIG. 3 illustrates a programmed process by which the agricultural intelligence computer system generates one or more preconfigured agronomic models using field data provided by one or more data sources. FIG. 3 may serve as an algorithm or instructions for programming the functional elements of the agricultural intelligence computer system 130 to perform the operations that are now described.

At block 305, the agricultural intelligence computer system 130 is configured or programmed to implement agronomic data preprocessing of field data received from one or more data sources. The field data received from one or more data sources may be preprocessed for the purpose of removing noise, distorting effects, and confounding factors within the agronomic data including measured outliers that could adversely affect received field data values. Embodiments of agronomic data preprocessing may include, but are not limited to, removing data values commonly associated with outlier data values, specific measured data points that are known to unnecessarily skew other data values, data smoothing, aggregation, or sampling techniques used to remove or reduce additive or multiplicative effects from noise, and other filtering or data derivation techniques used to provide clear distinctions between positive and negative data inputs.

At block 310, the agricultural intelligence computer system 130 is configured or programmed to perform data subset selection using the preprocessed field data in order to identify datasets useful for initial agronomic model generation. The agricultural intelligence computer system 130 may implement data subset selection techniques including, but not limited to, a genetic algorithm method, an all subset models method, a sequential search method, a stepwise regression method, a particle swarm optimization method, and an ant colony optimization method. For example, a genetic algorithm selection technique uses an adaptive heuristic search algorithm, based on evolutionary principles of natural selection and genetics, to determine and evaluate datasets within the preprocessed agronomic data.

At block 315, the agricultural intelligence computer system 130 is configured or programmed to implement field dataset evaluation. In an embodiment, a specific field dataset is evaluated by creating an agronomic model and using specific quality thresholds for the created agronomic model. Agronomic models may be compared and/or validated using one or more comparison techniques, such as, but not limited to, root mean square error with leave-one-out cross validation (RMSECV), mean absolute error, and mean percentage error. For example, RMSECV can cross validate agronomic models by comparing predicted agronomic property values created by the agronomic model against historical agronomic property values collected and analyzed. In an embodiment, the agronomic dataset evaluation logic is used as a feedback loop where agronomic datasets that do not meet configured quality thresholds are used during future data subset selection steps (block 310).

At block 320, the agricultural intelligence computer system 130 is configured or programmed to implement agronomic model creation based upon the cross validated agronomic datasets. In an embodiment, agronomic model creation may implement multivariate regression techniques to create preconfigured agronomic data models.

At block 325, the agricultural intelligence computer system 130 is configured or programmed to store the preconfigured agronomic data models for future field data evaluation.

2.5. Implementation Example—Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 4 is a block diagram that illustrates a computer system 400 upon which an embodiment of the invention may be implemented. Computer system 400 includes a bus 402 or other communication mechanism for communicating information, and a hardware processor 404 coupled with bus 402 for processing information. Hardware processor 404 may be, for example, a general purpose microprocessor.

Computer system 400 also includes a main memory 406, such as a random access memory (RAM) or other dynamic storage device, coupled to bus 402 for storing information and instructions to be executed by processor 404. Main memory 406 also may be used for storing temporary variables or other intermediate information during execution of instructions to be executed by processor 404. Such instructions, when stored in non-transitory storage media accessible to processor 404, render computer system 400 into a special-purpose machine that is customized to perform the operations specified in the instructions.

Computer system 400 further includes a read only memory (ROM) 408 or other static storage device coupled to bus 402 for storing static information and instructions for processor 404. A storage device 410, such as a magnetic disk, optical disk, or solid-state drive is provided and coupled to bus 402 for storing information and instructions.

Computer system 400 may be coupled via bus 402 to a display 412, such as a cathode ray tube (CRT), for displaying information to a computer user. An input device 414, including alphanumeric and other keys, is coupled to bus 402 for communicating information and command selections to processor 404. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

Computer system 400 may implement the techniques described herein using customized hard-wired logic, one or more ASICs or FPGAs, firmware and/or program logic which in combination with the computer system causes or programs computer system 400 to be a special-purpose machine. According to one embodiment, the techniques herein are performed by computer system 400 in response to processor 404 executing one or more sequences of one or more instructions contained in main memory 406. Such instructions may be read into main memory 406 from another storage medium, such as storage device 410. Execution of the sequences of instructions contained in main memory 406 causes processor 404 to perform the process steps described herein. In alternative embodiments, hardwired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical disks, magnetic disks, or solid-state drives, such as storage device 410. Volatile media includes dynamic memory, such as main memory 406. Common forms of storage media include, for example, a floppy disk, a flexible disk, hard disk, solid-state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 402. Transmission media can also take the form of acoustic or light waves, such as those generated during radio-wave and infrared data communications.

Various forms of media may be involved in carrying one or more sequences of one or more instructions to processor 404 for execution. For example, the instructions may initially be carried on a magnetic disk or solid-state drive of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infrared signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 404.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card, cable modem, satellite modem, or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are example forms of transmission media.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution.

3. Functional Description

In some embodiments, the sampling server is programmed or configured with data structures and/or database records that are arranged to receive one or more of the following items as input data: a set of agricultural characteristics with their global ranges and relative sensitivities, a list of management zones, a corresponding list of sets of model values for the agricultural characteristics used by an agricultural modeling tool, a corresponding list of modeling results (e.g., predictions) produced by the agricultural modeling tool, a map including agricultural characteristic values associated with a list of locations, a width of a buffer area around each management zone, and a minimum distance between adjacent sampling points.

In some embodiments, the server is programmed to produce one or more of the following items as output data: a set of selected locations, a comparison between the values of the agricultural characteristics associated with the selected locations and representative values of the agricultural characteristics for the management zones used in the agricultural modeling tool, possible explanations for any discrepancies revealed in the comparison between the measured outcomes at the selected locations and the model-predicted outcome, or recommendations related the agricultural modeling tool.

3.1 Generating Field Data or Model Data

Figure 7:
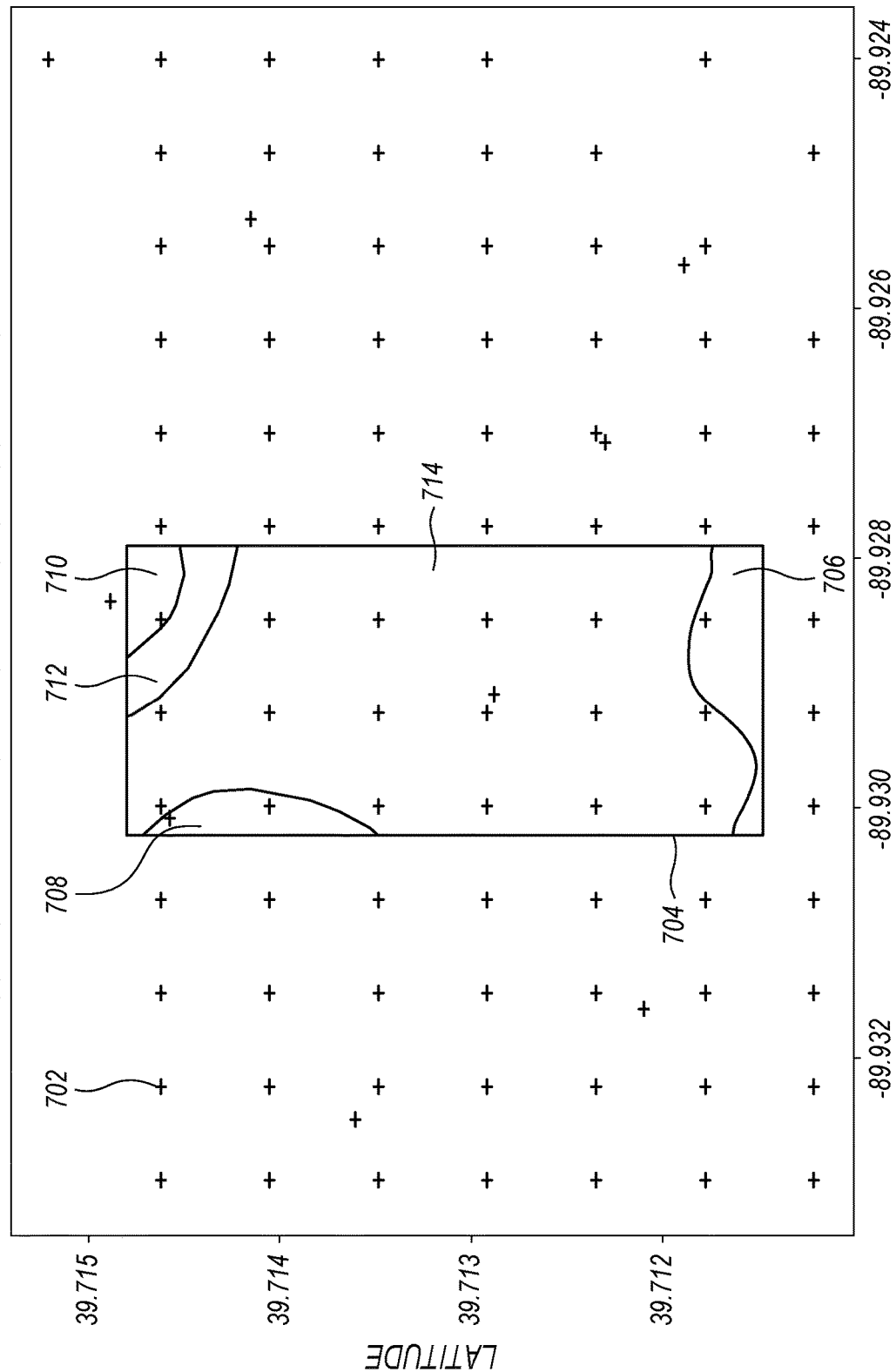
FIG. 7 illustrates an example layout of a field.

FIG. 7 illustrates an example layout of a field.

In some embodiments, the field 704 can comprise a number of management zones, such as the management zones 706, 708, 710, 712, or 714. The field may contain a field-level buffer area, where a planter or another machine makes a turn. The frequent traffic makes the field-level buffer unsuitable for data collection. Each management zone may also contain a regional buffer area. A regional buffer area generally identifies the sides of a management zone that can be contaminated by treatments in neighboring management zones or may often be reserved for specific grower experiments, such as adjusted seeding rates. Therefore, a regional buffer area is generally not suited for systematic sampling. Given a list of management zones that do not overlap with the field-level buffer area and the width of the regional buffer area for each management zone, the server can be programmed to refine each management zone by removing the regional buffer area from consideration. The width of a regional buffer area can vary among different management zones or even among different ends of a single management zone. An example width is six meters.

In some embodiments, the server is programmed to define a sampling unit in the field, such as the sampling unit 702, and delineates sampling units within each management zone. The size or shape of a sampling unit can be determined based on how a soil sample is collected or how a soil treatment is applied. For example, a soil sample is typically not collected at a point but by mixing cores obtained from a circular sample area. The radius of such a circular sample area may then dictate the size of a sampling unit, which in turn determines the distance between two sampling locations. For example, the size of a sampling unit can be set to be larger than substantially one or more than one of such circular sample area. An example radius is three meters.

In some embodiments, a given map may contain one or more values of a set of agricultural characteristics for a plurality of locations available from available databases, such as the Soil Survey Geographic Database ("SSURGO") maintained by the National Resources Conservation Service. The given map can also contain data measured with a sensing device with a grower in the field or by remotely operating an unmanned vehicle.

In some embodiments, a given map may include no complete set of agricultural characteristic values for a delineated sampling unit (a "non-covered sampling unit") or at least one complete set of agricultural characteristic values for a delineated sampling unit (a "covered sampling unit"). When more than one set of agricultural characteristic values are available for a sampling unit, the server can be programmed to determine one set of agricultural characteristic values from a selection or an aggregation of the more than one set of agricultural characteristic values. For a non-covered sampling unit, the server can be programmed to determine one complete set of agricultural characteristic values based on the sets of agricultural characteristic values included by the map or previously determined. For example, the determination can be a selection of the set of agricultural characteristic values for the nearest covered sampling unit. When the global range of an agricultural characteristic is continuous, the determination can be an interpolation or extrapolation from the sets of agricultural characteristic values for nearby sampling units.

Figure 8:
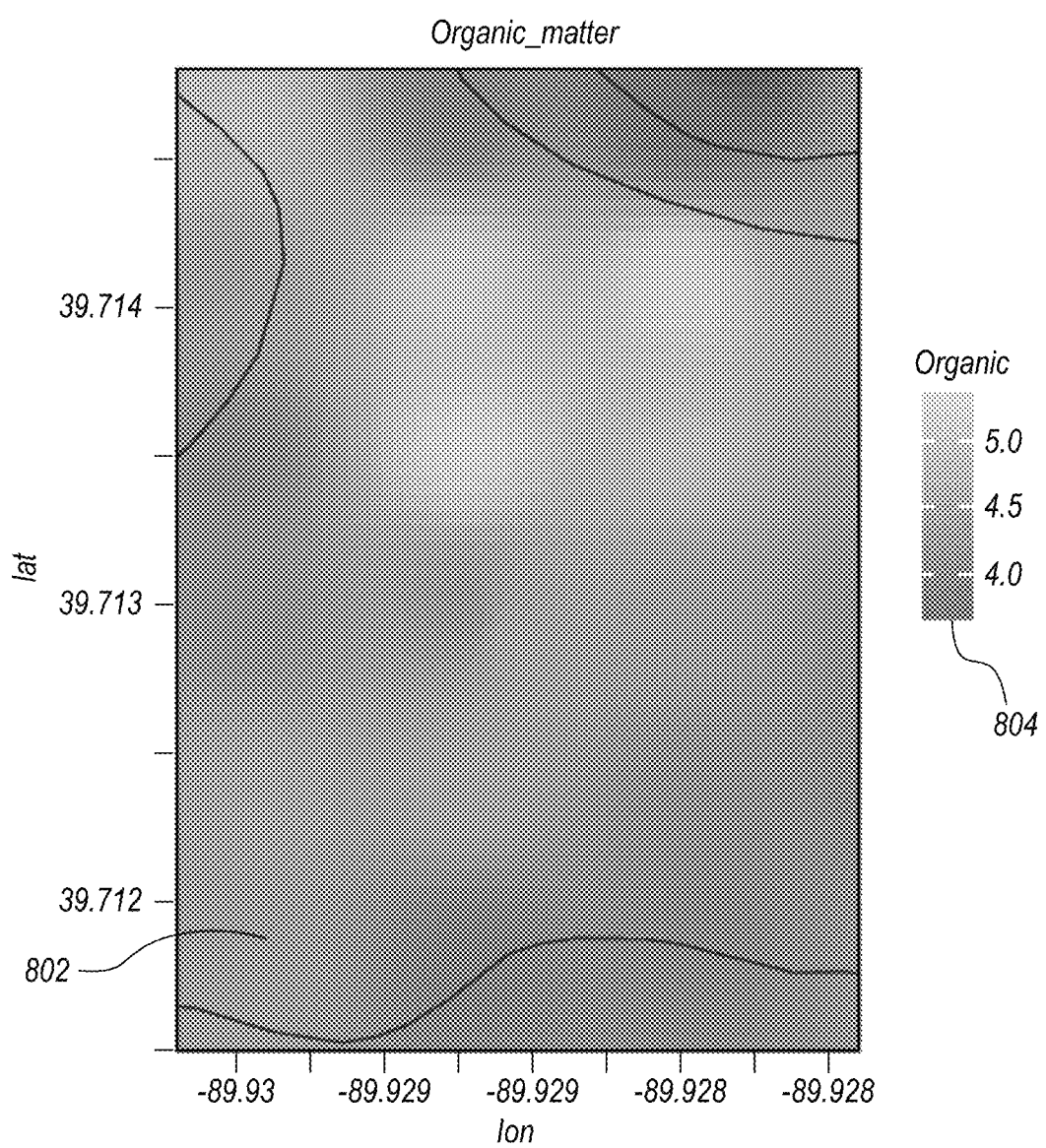
FIG. 8 illustrates an example refined map obtained by interpolating or extrapolating values from a given map.

FIG. 8 illustrates an example refined map obtained by interpolating or extrapolating values from a given map.

In the example of FIG. 8, a refined map 802 of field 704 (FIG. 7) is illustrated as a 2D plot of field topography using a vertical or Y axis showing latitude values and a horizontal or X axis showing longitude values. The refined map 802 now contains soil organic matter values represented by different shading levels for continuous locations within the field 802, based on the legend 804, resulting in a large number of sampling units available for further processing. In legend 804, the values 4.0, 4.5, 5.0 refer to the concentration of the soil organic matter in soil in terms of the percentage of total soil mass. A sampling unit for which a set of agricultural characteristic values is included in the map or determined by the server will be referred to as a candidate sampling location hereinafter.

In some embodiments, instead of receiving the list of sets of model values used by the agricultural modeling tool and the corresponding list of modeling results produced by the agricultural modeling tool, the server can be configured to receive a list of sets of model values and the agricultural modeling tool instead and execute the agricultural modeling tool on the sets of model values to generate the modeling results. Furthermore, the server can be configured to receive the agricultural modeling tool and generate sets of model values and corresponding modeling results. Specifically, aggregated values can be computed over the refined map or specific representative values can be selected from the refined map for each management zone and then used as model values for the agricultural modeling tool.

3.2 Normalizing or Weighting Agricultural Characteristic Values

In some embodiments, the server is programmed to normalize values of each agricultural characteristic to reconcile different units used for a single agricultural characteristic and to unify the scales of all the agricultural characteristics. Specifically, the server can convert each agricultural characteristic value into a quotient of the difference from the global minimum value for the agricultural characteristic to the global range. In other words, the scaled vector $\tilde{Z}_{S_j}$ of agricultural characteristic values for a candidate sampling location and the scaled vector $\tilde{Z}_{O_j}$ of model values used by an agricultural modeling tool can be computed as follows:

$$\tilde{z}_{S_j} = \frac{z_{S_j} - z_{j_{min}}}{z_{j_{max}} - z_{j_{min}}}; \tilde{z}_{O_j} = \frac{z_{O_j} - z_{j_{min}}}{z_{j_{max}} - z_{j_{min}}}$$

where j denotes the index of an agricultural characteristic and s denotes the index of a candidate sampling location in the management zone S, where $z_{j_{max}}$ denotes the global maximum and $z_{j_{min}}$ denotes the global minimum for the jth agricultural characteristic, where $z_{S_j}$ denotes the value of the jth agricultural characteristic for the sth candidate sampling location and $z_{O_j}$ denotes the model value of the jth agricultural characteristic used by the agricultural modeling tool.

In some embodiments, the server is programmed to further weight values of the different agricultural characteristics. The weights for the different agricultural characteristics can be predetermined constants or received as input data. For example, the weights can reflect relative sensitivities or other significance values of the agricultural characteristics so that a larger weight for an agricultural characteristic would require a smaller difference between that agricultural characteristic value for a candidate sampling location and the corresponding model value used by the agricultural modeling tool in order for the candidate sampling location to be selected.

3.3 Selecting Sampling Locations

In some embodiments, the server is then configured to select a candidate sampling location u for each management zone that minimizes the following distance metric:

$$u \equiv \underset{s \in S}{\text{argmin}} \sum_j w_j |\tilde{z}_{s_j} - \tilde{z}_{O_j}|$$

In some embodiments, each component of the sum above can be absolute value of the difference between $\tilde{z}_{s_j} - \tilde{z}_{O_j}$ or the square of that difference. Other distance metrics known to someone skilled in the art can be used. A customized distance function, which may incorporate the normalizing or weighting discussed above or a variant thereof, can also be used. For example, some agricultural characteristics may be correlated, and the customized distance function may include dynamic weights that depend on the strength of the correlations of an agricultural characteristic with other agricultural characteristics included in the comparison.

In some embodiments, when more than one candidate sampling location minimizes the distance metric for a management zone, the server can then be programmed to apply additional criteria to choose one from the more than one candidate sampling location. Example additional criteria or constraints include having a minimum distance to the boundary of the management zone or having an agricultural characteristic value in a specific range. These additional criteria or constraints can also be applied earlier to filter candidate sampling locations upfront. The server can also be configured to reevaluate the distance metric with adjusted weights for the more than one candidate sampling location.

In some embodiments, the server is configured to transmit data regarding the selected sampling locations to a display device or a remote client device. For each selected sampling location, the data can include the geographic coordinate (e.g., longitude and latitude), index of the enclosing management zone, distance from the boundary of the enclosing management zone, the corresponding set of agricultural characteristic values, or the corresponding value of the distance metric.

Figure 9:
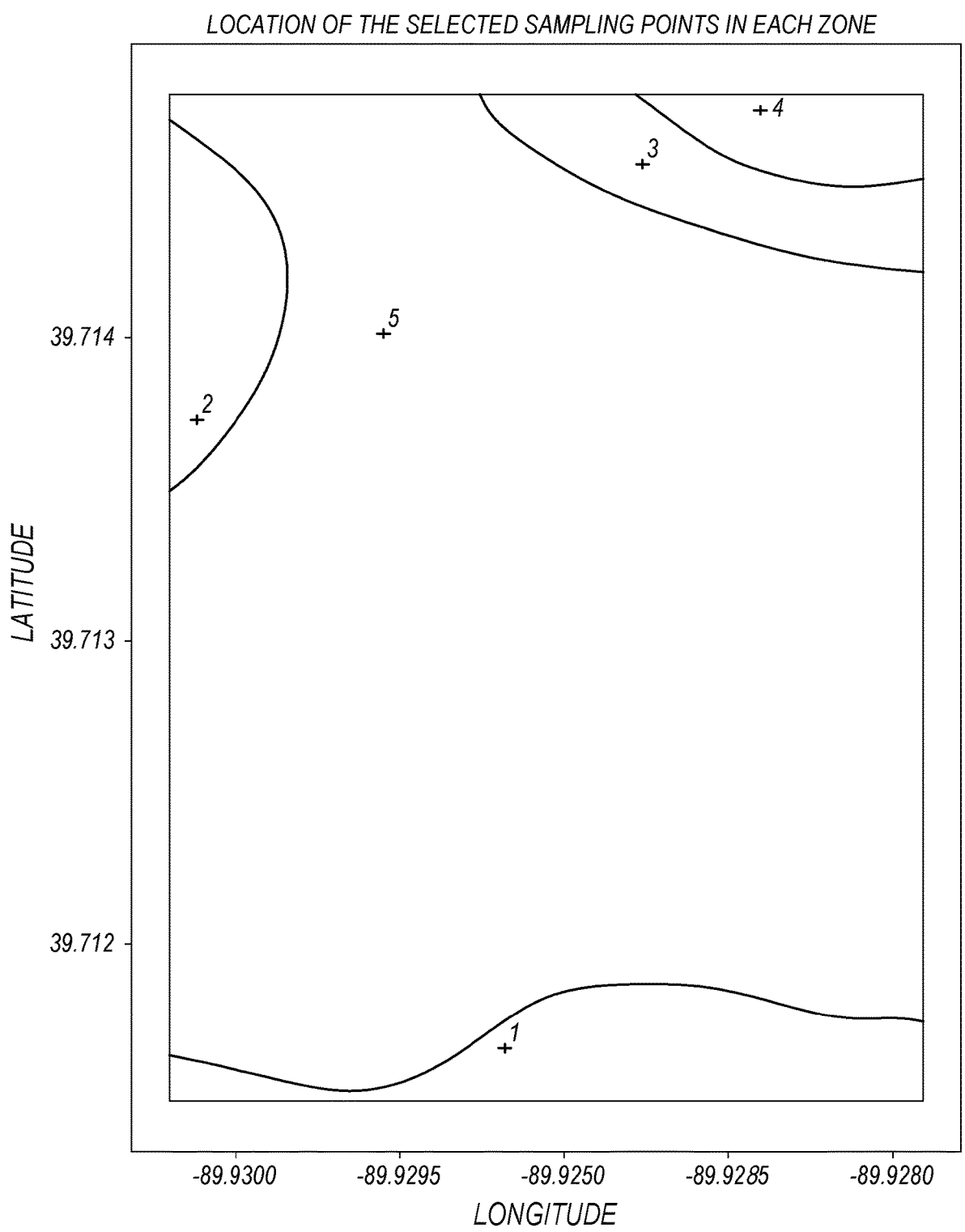
FIG. 9 illustrates an example graphical display of data related to selected sampling locations.

FIG. 9 illustrates an example graphical display of data related to selected sampling locations.

In the example of FIG. 9, the selected locations for the management zones of field 704 as shown in FIG. 7 and field 802 as shown in FIG. 8 are marked by the "+" signs. For each selected location, the graphical display indicates the approximate geographical coordinate with respect to the longitude axis and the latitude axis, the index of the enclosing management zone (1 through 5), and the approximate distance to the boundary of the enclosing management zone. Based on this graphical display or other data regarding the selected locations, a grower can take a measurement at a selected location to evaluate the performance of the agricultural modeling tool used for the management zone.

In some embodiments, the server is further configured to receive information regarding the validation of the agricultural modeling tool at the selected sampling locations. For example, the agricultural modeling tool can determine the current nitrate level in the soil. The grower can then measure the nitrate level in the soil at the selected sampling location and report that measurement. The server can be configured to generate and transmit relevant data to a display device, a remote client device, or a remote server computer that maintains the agricultural modeling tool, for an understanding or improvement of the performance of the agricultural modeling tool.

In some embodiments, the server can be configured to generate and transmit data indicating any difference between the agricultural characteristic values for a selected sampling location and the corresponding model values, any discrepancy between the actual soil performance and the modeling outcome, a possible relationship between the difference and the discrepancy, an explanation for the discrepancy, or a recommendation for whether to generalize the modeling results to an entire management zone.

In some embodiments, potential explanations for any discrepancy between the actual soil performance and the modeling outcome, or factors that may affect the quality of the selected locations for model validation or related purposes, include the weights assigned to the agricultural characteristics, the uniformity of values in these agricultural characteristics across a management zone, the accuracy of the given global ranges of the agricultural characteristics, the accuracy or resolution of the given map, the accuracy of the map refinement method, the complexity of the relationship between the agricultural characteristics and the modeling results, or the accuracy of the agricultural modeling tool. The quality of the selected locations may in turn determine whether the modeling results should be generally adopted. For example, the server can be configured to determine that for a management zone having highly uniform values in the agricultural characteristics and a given map that accurately reflects the actual agricultural characteristic values, the selected location is expected to be ideal for model validation and the modeling result should be readily applied to the entire management zone.

3.5 Example Processes

Figure 10:
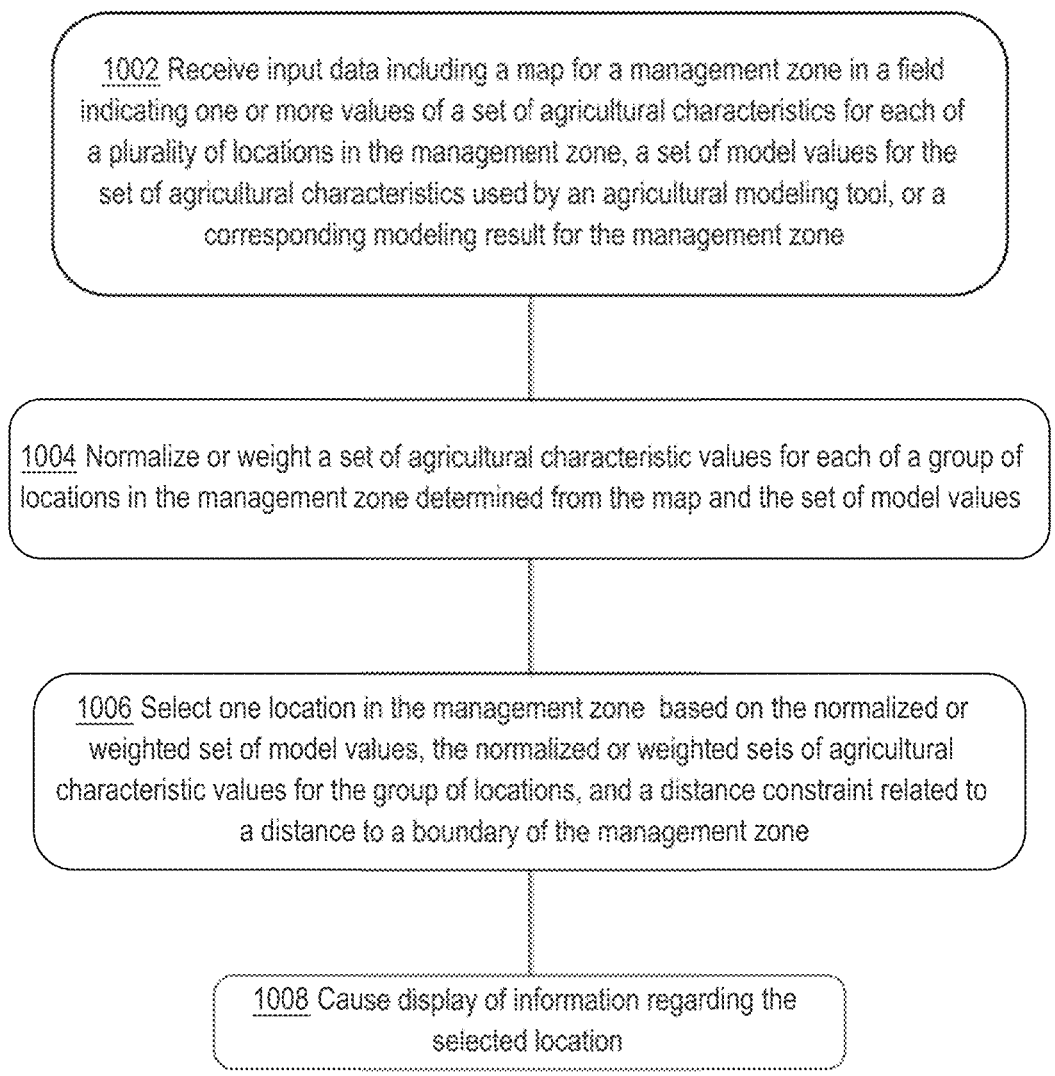
FIG. 10 illustrates an example process of selecting a sampling location in a management zone.

FIG. 10 illustrates an example process of selecting a sampling location in a management zone.

In some embodiments, in step 1002, the server is programmed to receive input data including one or more of the following: a set of agricultural characteristics with their global ranges, a map for the management zone indicating one or more values of the set of agricultural characteristics for each of a plurality of locations in the management zone, or a set of model values of the set of agricultural characteristics used by an agricultural modeling tool. The input data can also include a desired outcome, a buffer width for the management zone, or a minimum distance between adjacent sampling points.

In some embodiments, server can be programmed to generate field data or model data. Specifically, the server can be configured to define sampling units that are subject to various distance constraints, such as having any two sampling points separated by a minimum distance or having no sampling points within a minimum distance from the boundary of the management zone. The server can also be configured to expand the set of agricultural characteristic values included in the given map through duplication, interpolation, extrapolation, imputation, or other techniques to increase the number of candidate sampling locations as well as the number of agricultural characteristic values for each candidate sampling location. In addition, with the updated map, the server can be configured to feed the agricultural modeling tool new model values for the agricultural characteristics and receive new modeling results.

In some embodiments, in step 1004, the server is programmed to normalize or weight the agricultural characteristic values to eliminate issues caused by different measuring units while allowing flexibility in the treatment of different agricultural characteristics. The normalization can be done based on the global ranges of the agricultural characteristics. The weighting can be done based on relative sensitivities or other relevant significance values of the agricultural characteristics.

In some embodiments, in step 1006, the server is programmed to then select one of the candidate sampling locations in the management zone based on the normalized and weighted values. The server is configured to first identify those candidate sampling locations that minimize a distance metric measuring the distance between the values for the agricultural characteristics at these candidate sampling locations and the model values for the agricultural characteristics. The distance metric can include a sum of weighted absolute differences or squared differences over all the agricultural characteristics. The distance metric can also comprise another distance function known to someone skilled in the art.

In some embodiments, when multiple candidate sampling locations minimize the distance metric, the server can be configured to report all these candidate sampling locations.

Alternatively, the server is configured to then select one of the multiple sampling locations having the smallest distance to the boundary of the management zone. Other criteria or constraints can be used to narrow down the list of candidate sampling locations, such as having a smallest distance to one specific side of the management zone or having an agricultural characteristic value in a particular range.

In some embodiments, in step 1008, the server is programmed to transmit results of the sampling location to a display device, a remote client device, or a remote server that maintains the agricultural modeling tool. The results can include, for each selected sampling location, the geographic coordinate, the index of the enclosing management zone, the distance to the boundary of the enclosing management zone, the set of agricultural characteristic values, the difference from the model values, or the modeling result.

In some embodiments, after a user adopts the modeling result for the selected location, the server can be further configured to receive the measured outcome of the adoption, compare the measured outcome with the desired outcome, identify possible reasons for any discrepancy between the measured outcome and the desired outcome, and further communicate the possible reasons to the display device, the remote client device, or the remote server for improved understanding or development of the agricultural modeling tool.

What is claimed is:

1. A computer-implemented method of selecting sampling locations in a field and improving field growth based on sampling data, comprising:
   receiving, by a processor, input data including a map for a management zone in a field indicating one or more values of a set of agricultural characteristics for each of a plurality of locations in the management zone;
   identifying, by the processor, a set of values for the set of agricultural characteristics for each of a group of locations in the management zone based on the map;
   normalizing a set of model values for the set of agricultural characteristics used to create an agricultural modeling tool to predict an amount of an agricultural treatment material and normalizing the set of values of the set of agricultural characteristics for each of the group of locations in the management zone, the agricultural modeling tool comprising an electronic digitally stored set of executable instructions and data values created and applied using machine learning techniques;
   selecting one of the group of locations as a sampling location based on the normalized set of model values, the normalized sets of values for the group of locations, and a first distance constraint related to a distance to a boundary of the management zone;
   receiving a value of the agricultural treatment material sampled from the selected location by a soil sampling apparatus;
   determining that a difference between the sampled value and the predicted amount is below a first threshold and a uniformity in agricultural characteristics across an area including the selected location is above a second threshold;
   in response to the determining, applying the agricultural modeling tool to predict a specific amount of the agricultural treatment material for each specific location of the plurality of locations in the area;
   transmitting to an agricultural apparatus an executable script including an adjustment amount of the agricultural treatment material at one or more of the plurality of locations in the area, the executable script once received driving operation of the agricultural apparatus, including effecting the adjustment based on the corresponding one or more predicted amounts.

2. The computer-implemented method of claim 1, the set of agricultural characteristics including a soil physical characteristic or a topological characteristic.

3. The computer-implemented method of claim 1, further comprising:
   receiving the executable script;
   implementing the adjustment amount of the agricultural treatment material at the one or more locations in the area.

4. The computer-implemented method of claim 1, the identifying comprising:
   determining the group of locations based on a second distance constraint related to a distance between two sampling points or a third distance constraint related to a distance to the boundary of the management zone;
   selecting, interpolating, or extrapolating the one or more values for each of the plurality of locations in the management zone.

5. The computer-implemented method of claim 1,
   the input data further including a global range for each of the set of agricultural characteristics,
   the normalizing being based on the global ranges.

6. The computer-implemented method of claim 1,
   the input data further including a set of weights for the set of agricultural characteristics,
   the selecting comprising identifying a list of the group of locations that minimize a sum of weighted differences over the set of agricultural characteristics between the normalized value for one of the group of locations and the corresponding normalized model value,
   the differences being weighted using the set of weights.

7. The computer-implemented method of claim 6, the selecting further comprising applying the first distance constraint to the list of locations.

8. The computer-implemented method of claim 1, the first distance constraint favoring a small distance to the boundary of the management zone.

9. The computer-implemented method of claim 1, further comprising:
   causing display of information regarding the selected location.

10. The computer-implemented method of claim 9, the information indicating a geographical coordinate, a distance to the boundary of the management zone, or the set of agricultural characteristic values for the selected location.

11. One or more non-transitory storage media storing instructions which, when executed by one or more computing devices, cause performance of a method selecting sampling locations in a field and improving field growth based on sampling data, the method comprising:
   receiving input data including a map for a management zone in a field indicating one or more values of a set of agricultural characteristics for each of a plurality of locations in the management zone;
   identifying a set of values for the set of agricultural characteristics for each of a group of locations in the management zone based on the map;
   normalizing a set of model values for the set of agricultural characteristics used to create an agricultural modeling tool to predict an amount of an agricultural treatment material and normalizing the set of values of the set of agricultural characteristics for each of the group of locations in the management zone, the agricultural modeling tool comprising an electronic digitally stored set of executable instructions and data values created and applied using machine learning techniques;

selecting one of the group of locations as a sampling location based on the normalized set of model values, the normalized sets of values for the group of locations, and a first distance constraint related to a distance to a boundary of the management zone;

receiving a value of the agricultural treatment material sampled from the selected location by a soil sampling apparatus;

determining that a difference between the sampled value and the predicted amount is below a first threshold and a uniformity in agricultural characteristics across an area including the selected location is above a second threshold;

in response to the determining, applying the agricultural modeling tool to predict a specific amount of the agricultural treatment material for each specific location of the plurality of locations in the area;

transmitting to an agricultural apparatus an executable script including an adjustment amount of the agricultural treatment material at one or more of the plurality of locations in the area, the executable script once received drives operation of the agricultural apparatus, including effecting the adjustment based on the corresponding one or more predicted amounts.

12. The one or more non-transitory storage media of claim 11, the set of agricultural characteristics including a soil physical characteristic or a topological characteristic.

13. The one or more non-transitory storage media of claim 11, the method further comprising:
receiving the executable script;
implementing the adjustment amount of the agricultural treatment material at the one or more locations in the area.

14. The one or more non-transitory storage media of claim 11, the identifying comprising:
determining the group of locations based on a second distance constraint related to a distance between two sampling points or a third distance constraint related to a distance to the boundary of the management zone;
selecting, interpolating, or extrapolating the one or more values for each of the plurality of locations in the management zone.

15. The one or more non-transitory storage media of claim 11,
the input data further including a global range for each of the set of agricultural characteristics,
the normalizing being based on the global ranges.

16. The one or more non-transitory storage media of claim 11,
the input data further including a set of weights for the set of agricultural characteristics,
the selecting comprising identifying a list of the group of locations that minimize a sum of weighted differences over the set of agricultural characteristics between the normalized value for one of the group of locations and the corresponding normalized model value,
the differences being weighted using the set of weights.

17. The one or more non-transitory storage media of claim 16, the selecting further comprising applying the first distance constraint to the list of locations.

18. The one or more non-transitory storage media of claim 11, the first distance constraint favoring a small distance to the boundary of the management zone.

19. The one or more non-transitory storage media of claim 11, the method further comprising:
causing display of information regarding the selected location.

20. The one or more non-transitory storage media of claim 19, the information indicating a geographical coordinate, a distance to the boundary of the management zone, or the set of agricultural characteristic values for the selected location.

* * * * *